US008149025B2

(12) United States Patent
Huang et al.

(10) Patent No.: US 8,149,025 B2
(45) Date of Patent: Apr. 3, 2012

(54) GATE DRIVING CIRCUIT

(75) Inventors: Wen-Chiang Huang, Hsin-Chu (TW); Chih-Sung Wang, Hsin-Chu (TW); Yu-Hsi Ho, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/774,134

(22) Filed: May 5, 2010

(65) Prior Publication Data

US 2011/0273226 A1 Nov. 10, 2011

(30) Foreign Application Priority Data

Dec. 28, 2009 (TW) ............................... 98145321 A

(51) Int. Cl.
*H03K 3/00* (2006.01)

(52) U.S. Cl. ........ 327/108; 327/112; 327/170; 327/374; 327/379; 327/284; 326/21; 326/82; 345/204; 345/87

(58) Field of Classification Search .......... 327/108–112, 327/170, 374–377, 379, 284; 326/21–24, 326/82–84, 89; 345/204–207, 87
See application file for complete search history.

(56) References Cited

U.S. PATENT DOCUMENTS

| | | | | |
|---|---|---|---|---|
| 6,920,054 | B2 * | 7/2005 | Florence et al. | 363/41 |
| 7,397,459 | B2 * | 7/2008 | Abe et al. | 345/98 |
| 7,592,990 | B2 * | 9/2009 | Miyazawa | 345/90 |
| 2008/0218149 | A1 | 9/2008 | Aoki et al. | |
| 2008/0225036 | A1 * | 9/2008 | Song et al. | 345/213 |
| 2008/0303765 | A1 * | 12/2008 | Nakatsuka | 345/87 |

FOREIGN PATENT DOCUMENTS

TW I302283 B 10/2008

* cited by examiner

*Primary Examiner* — Lincoln Donovan
*Assistant Examiner* — Shikha Goyal
(74) *Attorney, Agent, or Firm* — Chung-Ming Shih

(57) ABSTRACT

An exemplary gate driving circuit is adapted for receiving an external gate power supply voltage and an external control signal, sequentially generating multiple internal shift data signal groups and thereby sequentially outputting multiple gate signals. Each of the internal shift data signal groups includes multiple sequentially-generated internal shift data signals. The gate driving circuit includes multiple gate signal generating modules. Each of the gate signal generating modules includes a voltage modulation circuit and a gate output buffer circuit. The voltage modulation circuit modulates the external gate power supply voltage according to a corresponding one of the internal shift data signal groups and the external control signal, and thereby a modulated voltage signal is obtained. The gate output buffer circuit includes a plurality of parallel-coupled output stages. The output stages output the modulated voltage signal as a part of the gate signals during the output stages being sequentially enabled.

9 Claims, 6 Drawing Sheets

GATE DRIVING CIRCUIT

CROSS-REFERENCE TO RELATED APPLICATIONS

This application is based upon and claims the benefit of priority from the prior Taiwan Patent Application No. 098145321, filed Dec. 28, 2009, the entire contents of which are incorporated herein by reference.

BACKGROUND

1. Technical Field

The present invention generally relates to display technology fields and, particularly to a gate driving circuit adapted for applying into active matrix display devices.

2. Description of the Related Art

Referring to FIG. 1, showing a schematic structural diagram of a conventional active matrix display device. As illustrated in FIG. 1, the active matrix display device 100 includes a display substrate 110, a printed circuit board 130, a plurality of source driver integrated circuits (not labeled) electrically coupled between the display substrate 110 and the printed circuit board 130, and a gate driving circuit including a plurality of cascade-connected gate driver integrated circuits Y1, Y2. The display substrate 110 has a thin film transistor array (not shown) formed thereon. The gate driver integrated circuits Y1, Y2 of the gate driving circuit are electrically coupled to the thin film transistor array of the display substrate 110 to switch the on/off states of thin film transistors in the thin film transistor array. The printed circuit board 130 has a pulse width modulation circuit 132 formed thereon. The pulse width modulation circuit 132 is subjected to the control of the control signal CS to modulate (e.g., angling modulate) the gate power supply voltage VGH and thereby a modulated voltage signal VGG is obtained. The modulated voltage signal VGG then is inputted into the gate driver integrated circuits Y1, Y2 of the gate driving circuit. Herein, the gate power supply voltage VGH is modulated by the pulse width modulation circuit 132, which facilitates a waveform of a gate signal during controlling the thin film transistors electrically coupled at the head of a gate line to be approximately the same as a waveform of the gate signal during controlling the thin film transistors electrically coupled at the tail of the gate line, and therefore even/uniform display effect can be achieved.

However, during the gate power supply voltage VGH is angling modulated to be the modulated voltage signal VGG, since the cascade-connected gate driving integrated circuits Y1, Y2 use the modulated voltage signal VGG provided by the same pulse width modulation circuit 132 as respective power supply voltages and further the potential of the modulated voltage signal VGG is periodically varied, when the potential of the modulated voltage signal VGG is firstly angled to a low level from the gate power supply voltage VGH and then retrieved to the gate power supply voltage VGH, a discharging current formed in the pulse width modulation circuit 132 will dramatically increase and thereby occur a high peak current, which would easily result in large power loss, even circuit burnout.

BRIEF SUMMARY

Accordingly, the present invention is directed to a gate driving circuit, so as to effectively suppress the occurrence of high peak current and thereby avoid unwanted power loss and/or circuit burnout.

More specifically, a gate driving circuit in accordance with an embodiment of the present invention is adapted for receiving an external gate power supply voltage and an external control signal, sequentially generating a plurality of internal shift data signal groups and thereby sequentially outputting a plurality of gate signals. Each of the internal shift data signal groups includes a plurality of sequentially-generated internal shift data signals. The gate driving circuit includes a plurality of gate signal generating modules. Each of the gate signal generating modules includes a voltage modulation circuit and a gate output buffer circuit. The voltage modulation circuit modulates the external gate power supply voltage inputted into the voltage modulation circuit by using the external control signal and a corresponding one of the internal shift data signal groups and thereby a modulated voltage signal is obtained. The gate output buffer circuit includes a plurality of parallel-coupled output stages. The output stages are for outputting the modulated voltage signal as a part of the gate signals during being sequentially enabled.

In one embodiment, the gate signal generating modules are configured into a single gate driver integrated circuit, so that the gate driving circuit includes a single gate driver integrated circuit. Alternatively, the gate signal generating modules are configured into at least two gate driver integrated circuits, so that the gate driving circuit includes at least two gate driver integrated circuits.

In one embodiment, the voltage modulation circuit includes a first transistor, a second transistor and a control unit. The first source/drain of the first transistor is electrically couple to receive the external gate power supply voltage. The first source/drain of the second transistor is electrically coupled to the predetermined potential, the second source/drain of the second transistor is electrically coupled to the second source/drain of the first transistor and serves as an output terminal of the modulated voltage signal, the gate of the second transistor is electrically coupled to the gate of the first transistor. The control unit is for controlling voltages at the gates of the first and second transistors according to the external control signal and the corresponding one of the internal shift data signal groups, to determine on/off states of the first and second transistors. The on/off states of the first transistor are opposite to the on/off states of the second transistor.

In one embodiment, the output stages of the gate output buffer circuit are sequentially enabled by the corresponding one of the internal shift data signal groups.

A gate driving circuit in accordance with another embodiment of the present invention is adapted to an active matrix display device including a printed circuit board. The printed circuit board is for supplying a gate power supply voltage, a control signal and a predetermined potential. The gate driving circuit includes a gate power supply voltage input line, a control signal input line, a predetermined potential input line, a plurality of internal shift data output channel groups, and a plurality of gate signal generating modules. The gate power supply voltage input line is electrically coupled to receive the gate power supply voltage. The control signal input line is electrically coupled to receive the control signal. The predetermined potential input line is electrically coupled to the predetermined potential. Each of the gate signal generating modules includes a voltage modulation circuit and a gate output buffer circuit. The voltage modulation circuit is electrically coupled between the gate power supply voltage input line and the predetermined potential input line and further includes a plurality of input terminals and an output terminal. The input terminals are electrically coupled to the control signal input line and the corresponding one of the internal shift data output channel groups. The gate output buffer circuit is electrically coupled to the output terminal of the voltage modulation circuit to receive a modulated voltage signal obtained from modulating the gate power supply voltage by the voltage modulation circuit. The gate output buffer circuit further is for sequentially outputting a plurality of gate signals according to the modulated voltage signal.

In one embodiment, the gate signal generating modules are configured into a single gate driver integrated circuit, so that the gate driving circuit includes a single gate driver integrated circuit. Alternatively, the gate signal generating modules are configured into at least two gate driver integrated circuits, so that the gate driving circuit includes at least two gate driver integrated circuits.

In one embodiment, the voltage modulation circuit includes a first-conductivity type transistor, a second-conductivity type transistor and a control unit. The first source/drain of the first-conductivity type transistor is electrically coupled to the gate power supply input line. The first source/drain of the second-conductivity type transistor is electrically coupled to the predetermined potential input line, the second source/drain of the second-conductivity type transistor is electrically coupled to the second source/drain of the first-conductivity type transistor and serves as the output terminal of the voltage modulation circuit, and the gate of the second-conductivity type transistor is electrically coupled to the gate of the first-conductivity type transistor. The control unit is electrically coupled to the control signal input line and the corresponding one of the internal shift data output channel groups and for controlling on/off states of the first-conductivity type and second-conductivity type transistors.

In one embodiment, the gate output buffer circuit includes a plurality of output stages electrically coupled to one another in parallel. The output stages are respectively electrically coupled to a plurality of internal shift data output channels of the corresponding one of the internal shift data output channel groups and for outputting the gate signals during being sequentially enabled.

In one embodiment, the predetermined potential input line is electrically coupled to the predetermined potential through a resistor formed on the printed circuit board.

In summary, since the gate driving circuit in the above-mentioned embodiments of the present invention is demarcated into multiple gate signal generating modules, and each of the gate signal generating modules has a voltage modulation circuit (e.g., a circuit for angling modulation) electrically independent from any one of the other gate signal generating module(s), so that the gate signal generating modules use the respective modulated voltage signals provided by independent voltage modulation circuits as power supply voltages thereof. Accordingly, the occurrence of high peak current associated with the prior art can be effectively suppressed and thus unwanted power loss and/or the risk of circuit burnout can be avoided.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

In the following detailed description of the preferred embodiments, reference is made to the accompanying drawings which form a part hereof, and in which are shown by way of illustration specific embodiments in which the invention may be practiced. In this regard, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "coupled" and variations thereof herein are used broadly and encompass direct and indirect connections, and couplings. Accordingly, the drawings and descriptions will be regarded as illustrative in nature and not as restrictive.

Figure 1:
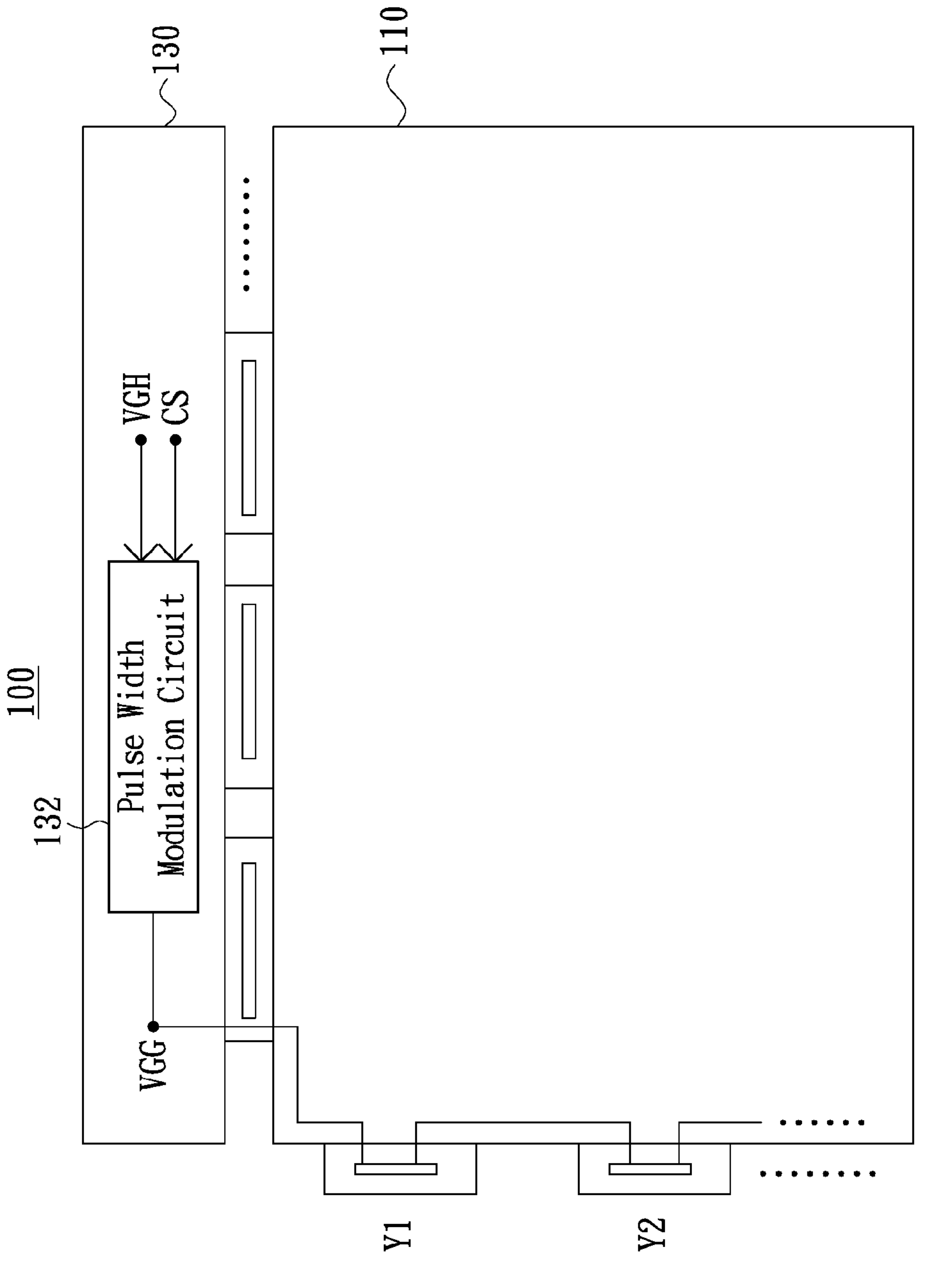
FIG. 1(Related Art)
FIG. 1 shows a schematic structural diagram of a conventional active matrix display device.
Figure 2:
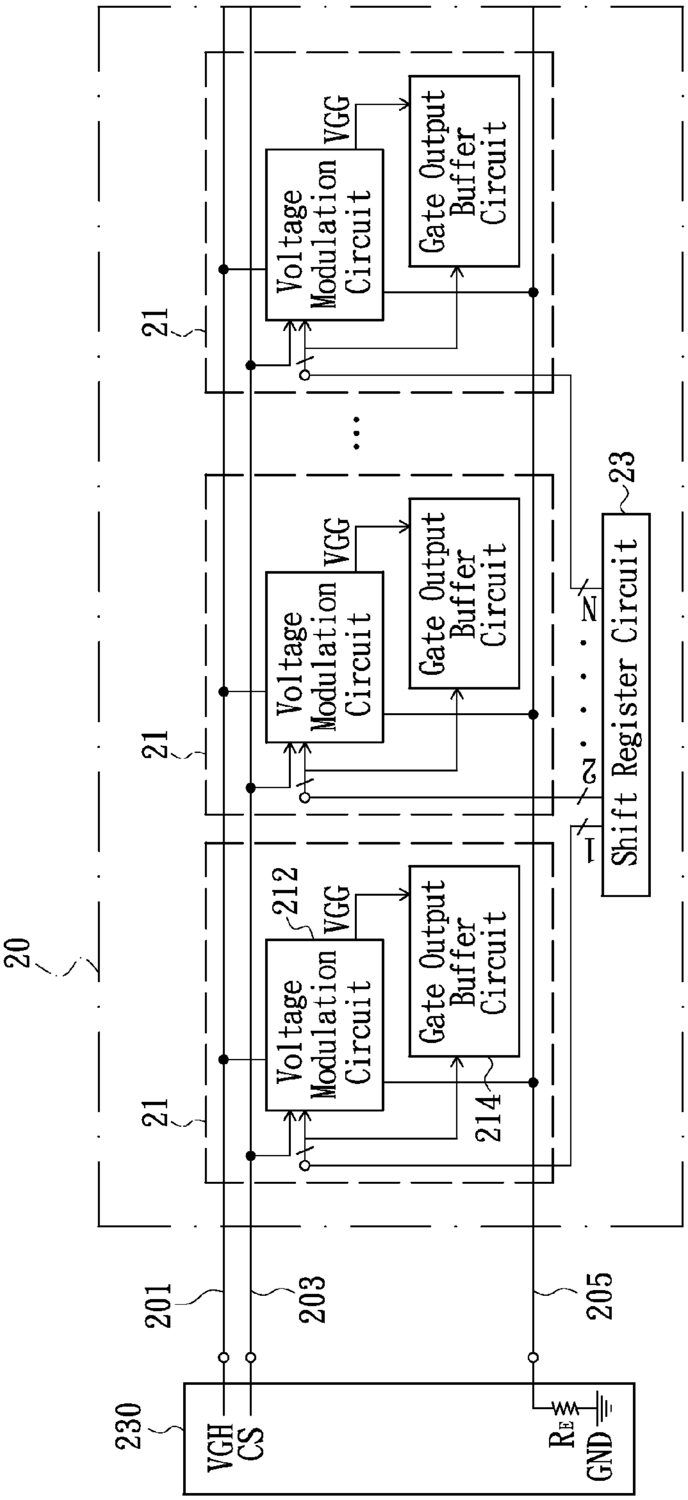
FIG. 2 shows a schematic circuit diagram of a gate driving circuit in accordance with an embodiment of the present invention.

Referring to FIG. 2, a gate driving circuit 20 in accordance with an embodiment of the present invention is electrically coupled with a printed circuit board 230. The printed circuit board 230 is for providing the gate driving circuit 20 with a gate power supply voltage VGH, a control signal CS and a predetermined potential e.g., grounding potential GND. The gate driving circuit 20 includes a gate power supply voltage input line 201, a control signal input line 203, a predetermined potential input line 205, a plurality of gate signal generating module 21 and a shift register circuit 23. The gate power supply voltage input line 201 is electrically coupled to receive the gate power supply voltage VGH. The control signal input signal 203 is electrically coupled to receive the control signal CS. The predetermined potential input line 205 is electrically coupled to the grounding potential GND through a resistor $R_E$ formed on the printed circuit board 230.

Moreover, each of the gate signal generating modules 21 includes a voltage modulation circuit 212 and a gate output buffer circuit 214. The voltage modulation circuit 212 is electrically coupled between the gate power supply voltage input line 201 and the predetermined potential input line 205. Multiple input terminals of the voltage modulation circuit 212 are electrically coupled to the control signal input line 203 and a corresponding one of multiple internal shift data output channel groups 1~N of the shift register circuit 23. The gate output buffer circuit 214 is electrically coupled to an output terminal of the voltage modulation circuit 212 to receive a modulated voltage signal VGG obtained from modulating the gate power supply voltage VGH by the voltage modulation circuit 212. Herein, the gate output buffer circuit 214 is for sequentially outputting a plurality of gate signals according to the modulated voltage signal VGG. In the illustrated embodiment, the gate output buffer circuit 214 further is electrically coupled to the corresponding one of the internal shift data output channel groups 1~N of the shift register circuit 23.

Figure 3:
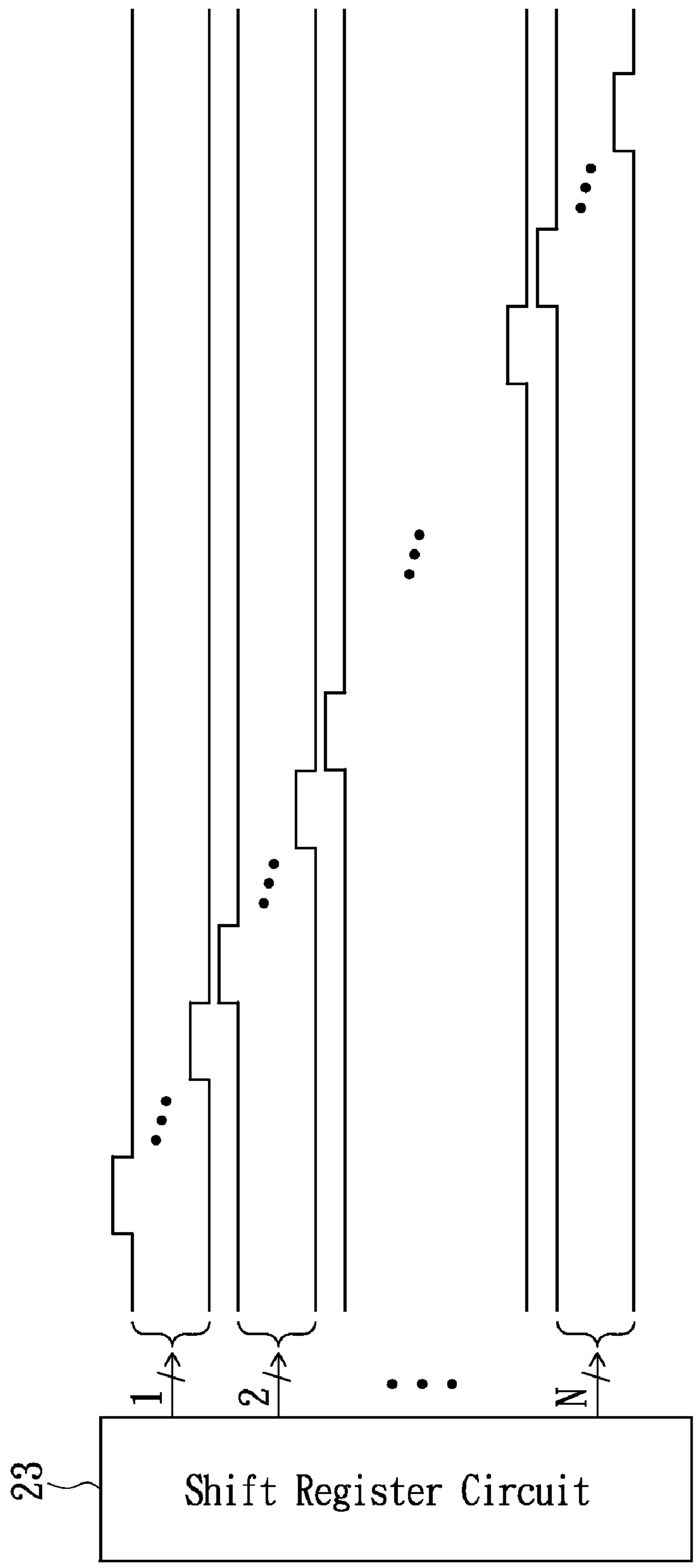
FIG. 3 shows a timing diagram of multiple internal shift data signal groups generated from a shift register circuit of the gate driving circuit of FIG. 2.

Referring to FIG. 3, each of the internal shift data output channel groups 1~N of the shift register circuit 23 includes a plurality of internal shift data output channels for sequentially generating a plurality of internal shift data signals. That is, the internal shift data output channel groups 1~N can sequentially generate N number of internal shift data signal groups, and each of the internal shift data signal groups includes a plurality of sequentially-generated internal shift data signals.

Figure 4:
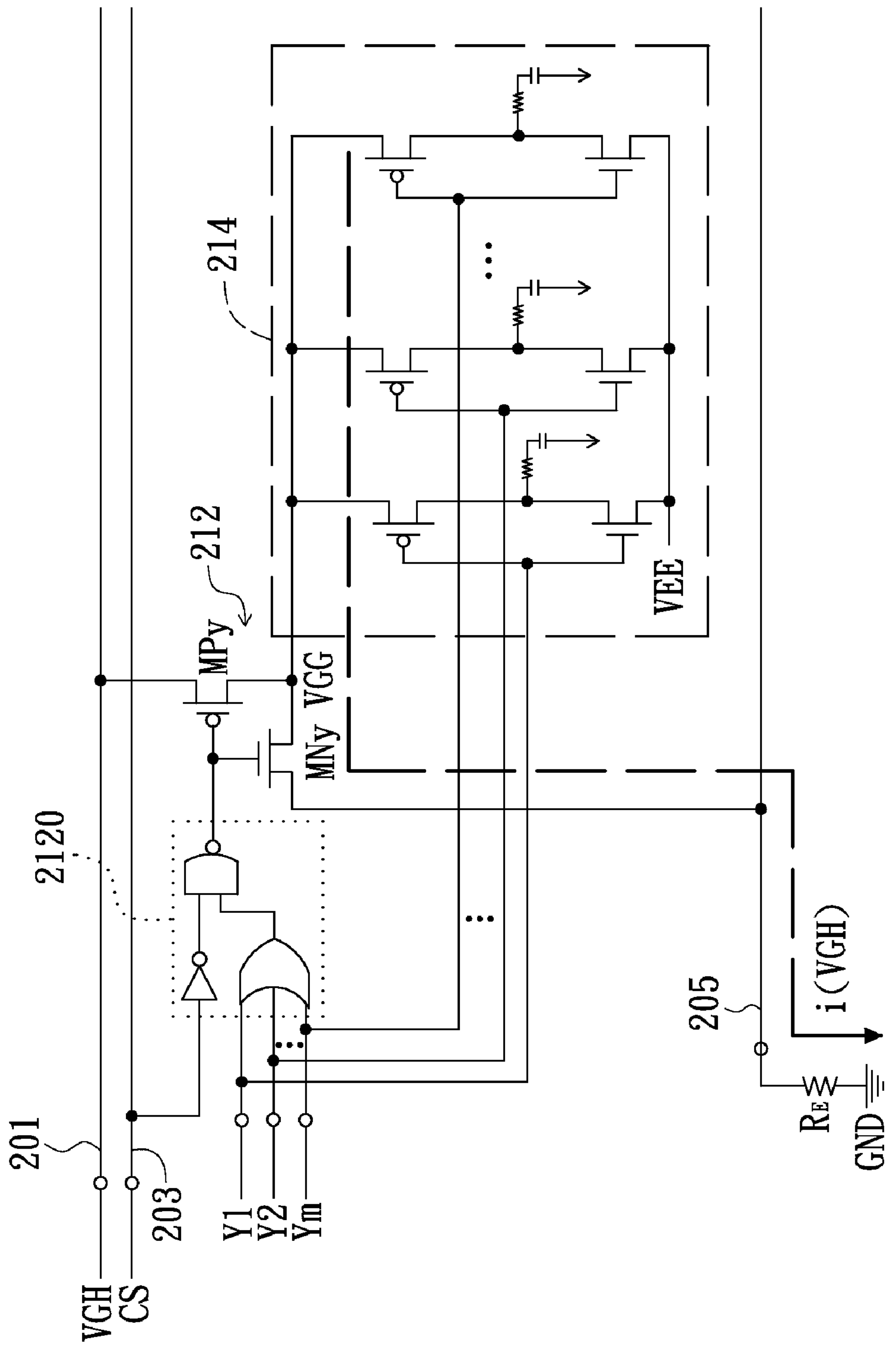
FIG. 4 shows a detailed circuit diagram of a gate signal generating module of the gate driving circuit of FIG. 2.

Referring to FIG. 4, showing a detailed circuit diagram of any one of the gate signal generating modules 21 in accordance with the embodiment of the present invention. As illustrated in FIG. 4, the voltage modulation circuit 212 includes a P-type transistor MPy, an N-type transistor MNy and a control unit 2120. The source of the P-type transistor MPy is electrically coupled to the gate power supply voltage input line 201 to receive the gate power supply voltage VGH, and the drain of the P-type transistor MPy serves as an output terminal of the modulated voltage signal VGG. The gate of the N-type transistor MNy is electrically coupled with the gate of the P-type transistor MPy, the source of the N-type transistor MNy is electrically coupled to the predetermined potential input line 205, and the drain of the N-type transistor MNy is electrically coupled to the drain of the P-type transistor MPy. The control unit 2120 includes an inverter, an OR gate and an NAND gate. The inverter is for performing an inversion operation applied to the control signal CS to obtain an inverted control signal. The OR gate is electrically coupled to internal shift data output channels Y~Ym of an internal shift data output channel group Y of the groups 1~N and for performing an OR operation applied to an internal shift data signal group provided from the internal shift data output channels Y1~Ym. The NAND gate is for performing an NAND operation applied to the inverted control signal and the result of the OR operation, so as to control on/off states of the P-type and N-type transistors MPy, MNy. Herein, the on/off states of the P-type transistor MPy are opposite to the on/off states of the N-type transistor MNy.

Figure 5:
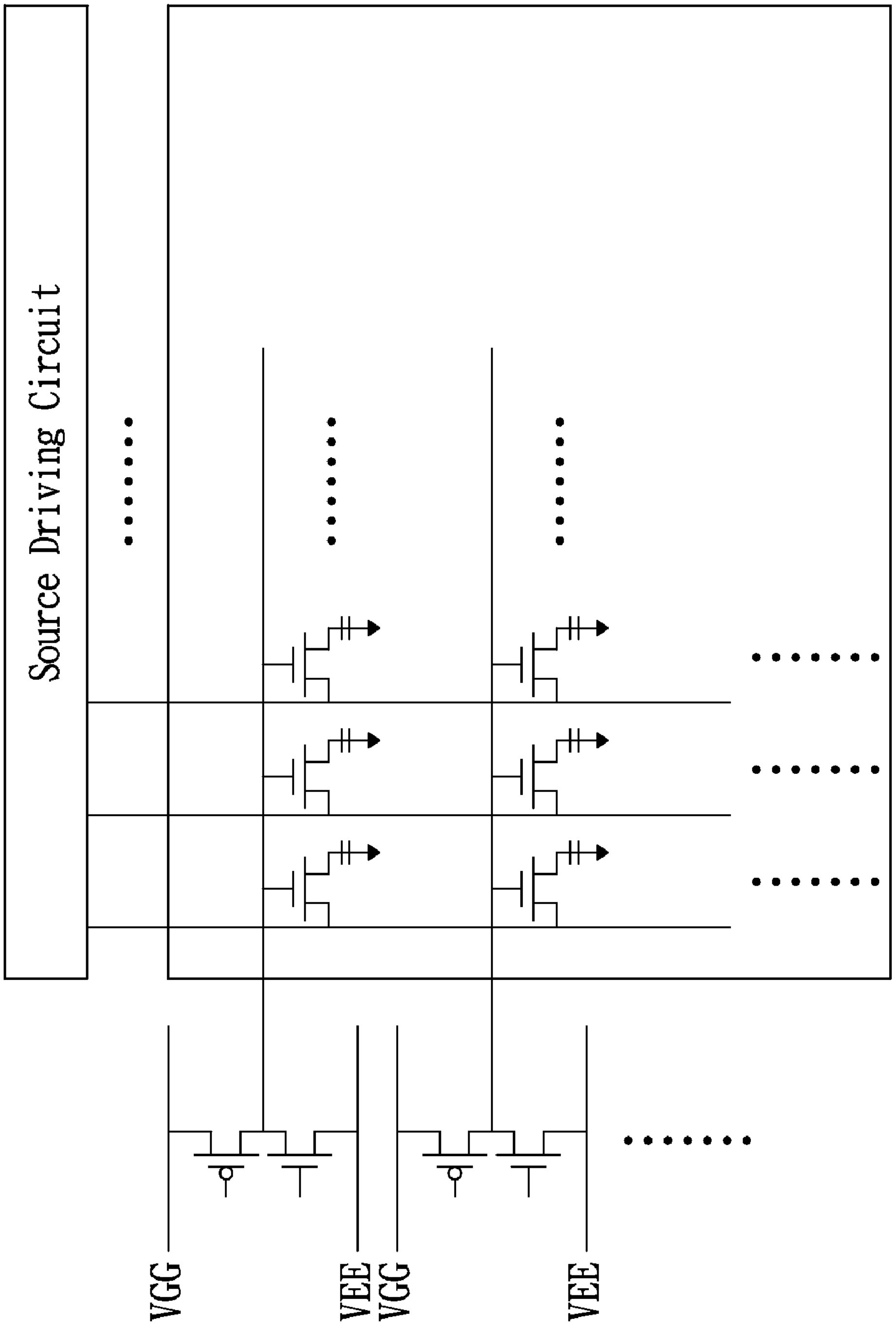
FIG. 5 shows an electrical connection relationship between output stages of FIG. 4 and gate lines.

The gate output buffer circuit 214 includes a plurality of parallel-coupled output stages. The output stages are respectively electrically coupled to the internal shift data output channels Y1~Ym. The output stages further are subjected to the control of the internal shift data signal group generated from the internal shift data output channels Y~Ym and thereby are sequentially enabled to output a plurality of gate signals. Moreover, each of the output stages includes a P-type transistor, an N-type transistor and a RC series circuit. The P-type and N-type transistors are electrically coupled in series and both electrically coupled between the modulated voltage signal VGG and a power supply voltage VEE. The RC series circuit is electrically coupled to the drains of the P-type and N-type transistors. In addition, the gates of the P-type and N-type transistors are electrically coupled with each other and both subjected to the control of one of the internal shift data signals Y1~Ym. Herein, the RC series circuit represents an effective load of a gate line electrically coupled to the corresponding output stage, and an actual circuit configuration thereof is shown in FIG. 5. In particular, as illustrated in FIG. 5, an output of the drains of the P-type and N-type transistors serves as the input of the gate line.

Figure 6:
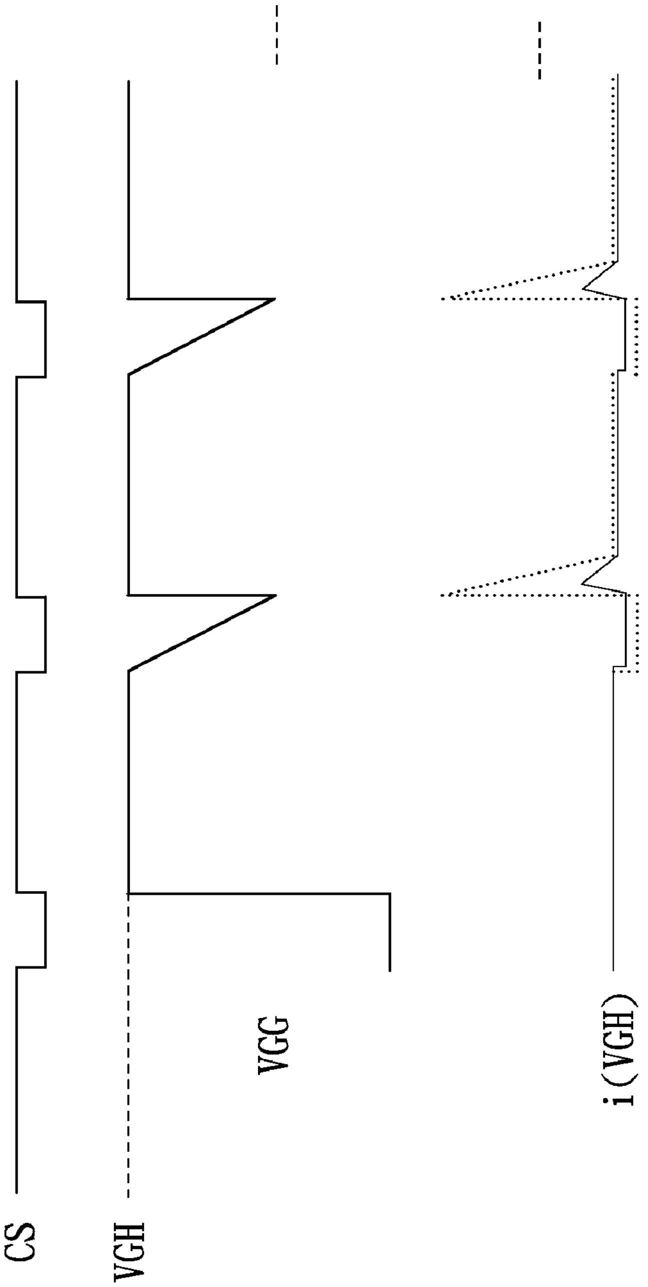
FIG. 6 shows a timing diagram of multiple signals associated with the gate signal generating module of FIG. 4.

Referring to FIG. 6, showing a timing diagram of multiple signals associated with any one of the gate signal generating modules 21. As seen from FIGS. 4 and 6 together, during the internal shift data output channels Y1~Ym generate the internal shift data signals, when the control signal CS is logic high level, the P-type transistor MPy is switched on while the N-type transistor MNy is switched off, at this time, the potential of the modulated voltage signal VGG is substantially equal to the gate power supply voltage VGH; then when the control signal CS changes from the logic high level to logic low level, the P-type transistor MPy is switched off while the N-type transistor MNy is switched on, at this moment, the potential of the modulated voltage signal VGG is lowered due to the discharge toward the grounding potential GND through the N-type transistor MNy and the resistor $R_E$, and thereby forms a current i(VGH) (as depicted by the solid line of FIG. 6). Afterwards, when the potential of the modulated voltage signal VGG is retrieved to the gate power supply voltage VGH, the current i(VGH) will dramatically increase and thereby occurs a peak current. However, the peak current i(VGH) associated with the present embodiment is largely reduced with respect to the peak current associated with the prior art which is depicted by dashed line of FIG. 6, the purpose of suppressing the occurrence of high peak current of the present invention is achieved.

It is noted that the output stages of the gate output buffer circuit 214 of any one of the gate signal generating modules 21 of the gate driving circuit 20 are not limited to be enabled by the corresponding internal shift data signals, and can be enabled by using other pulse signals. In addition, the gate signal generating modules 21 of the gate driving circuit 20 can be configured into a single gate driver integrated circuit or at least two gate driver integrated circuits instead. In other words, the gate driving circuit 20 includes a single gate driver integrated circuit or at least two gate driver integrated circuits instead.

In summary, since the gate driving circuit in the above-mentioned embodiments of the present invention is divided into multiple gate signal generating modules, and each of the gate signal generating modules has a voltage modulation circuit (e.g., a circuit for angling modulation) electrically independent from any one of the other gate signal generating module(s), so that the gate signal generating modules use the respective modulated voltage signals provided by independent voltage modulation circuits as power supply voltages thereof. Accordingly, the occurrence of high peak current associated with the prior art can be effectively suppressed and thus unwanted power loss and/or the risk of circuit burnout can be avoided.

Additionally, the skilled person in the art can make some modifications with respect to the gate driving circuit in accordance with the above-mentioned embodiments, for example, suitably changing the circuit configuration of the control unit, the amount of the shift register circuit, and/or interchanging the electrical connections of the sources and drains of the respective transistors, as long as such modification(s) would not depart from the scope and spirit of the present invention.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A gate driving circuit, adapted for receiving an external gate power supply voltage and an external control signal, sequentially generating a plurality of internal shift data signal groups and thereby sequentially outputting a plurality of gate signals, wherein each of the internal shift data signal groups comprises a plurality of sequentially-generated internal shift data signals; the gate driving circuit comprising a plurality of gate signal generating modules and each of the gate signal generating modules comprising:

a voltage modulation circuit, subjected to the control of the external control signal cooperative with a corresponding one of the internal shift data signal groups to determine whether directing the external gate power supply voltage inputted into the voltage modulation circuit to an output terminal of the voltage modulation circuit and thereby generating a modulated voltage signal at the output terminal of the voltage modulation circuit; and a gate output buffer circuit, electrically coupled to the output terminal of the voltage modulation circuit, comprising a plurality of output stages electrically connected with one another in parallel for sequentially outputting the modulated voltage signal as multiple ones of the gate signals to respectively drive multiple gate lines during the output stages being sequentially enabled;

wherein the voltage modulation circuit comprises:

a first transistor, wherein the first source/drain of the first transistor is electrically coupled to receive the external gate power supply voltage;

a second transistor, wherein the first source/drain of the second transistor is electrically coupled to a predetermined potential, the second source/drain of the second transistor is electrically coupled to the second source/drain of the first transistor and further serves as the output terminal of the modulated voltage signal, and the gate of the second transistor is electrically coupled to the gate of the first transistor; and a control unit, for controlling voltages at the gates of the first and second transistors according to the external control signal and the corresponding one of the internal shift data signal groups, to determine on/off states of the first and second transistors;

wherein the on/off states of the first transistor are opposite to the on/off states of the second transistor.

2. The gate driving circuit as claimed in claim 1, wherein the gate signal generating modules are configured into a single gate driver integrated circuit, so that the gate driving circuit comprises a single gate driver integrated circuit.

3. The gate driving circuit as claimed in claim 1, wherein the gate signal generating modules are configured into at least two gate driver integrated circuits, so that the gate driving circuit comprises at least two gate driver integrated circuits.

4. The gate driving circuit as claimed in claim 1, wherein the output stages of the gate output buffer circuit are sequentially enabled by the corresponding one of the internal shift data signal groups.

5. A gate driving circuit, adapted to a liquid crystal display comprising a printed circuit board, wherein the printed circuit board is adapted for providing a gate power supply voltage, a control signal and a predetermined potential; the gate driving circuit comprising:

a gate power supply voltage input line, electrically coupled to receive the gate power supply voltage;

a control signal input line, electrically coupled to receive the control signal;

a predetermined potential input line, electrically coupled to receive the predetermined potential;

a plurality of internal shift data output channel groups, each of the internal shift data output channel groups being for providing sequentially-generated internal shift data signals; and a plurality of gate signal generating modules, each of the gate signal generating modules comprising:

a voltage modulation circuit, electrically coupled between the gate power supply voltage input line and the predetermined potential input line and comprising a plurality of input terminals and an output terminal, the input terminals being electrically coupled to the control signal input line and a corresponding one of the internal shift data output channel groups and thereby the voltage modulation circuit is subjected to the control of a result of logic operation of the control signal with the sequentially-generated internal shift data signals from the corresponding one of the internal shift data output channel groups to determine whether directing the gate power supply voltage to the output terminal so as to produce a modulated voltage signal at the output terminal; and a gate output buffer circuit, electrically coupled to the output terminal of the voltage modulation circuit to receive the modulated voltage signal and for sequentially outputting the modulated voltage signal as a plurality of gate signals to respectively drive a plurality of gate lines;

wherein the voltage modulation circuit comprises:

a first-conductivity type transistor, wherein the first source/drain of the first-conductivity type transistor is electrically coupled to the gate power supply voltage input line;

a second-conductivity type transistor, wherein the first source/drain of the second-conductivity type transistor is electrically coupled to the predetermined potential input line, the second source/drain of the second-conductivity type transistor is electrically coupled to the second source/drain of the first-conductivity type transistor and serves as the output terminal of the voltage modulation circuit, the gate of the second-conductivity type transistor is electrically coupled to the gate of the first-conductivity type transistor; and a control unit, electrically coupled to the control signal input line and the corresponding one of the internal shift data output channel groups and for controlling on/off states of the first-conductivity type and second-conductivity type transistors.

6. The gate driving circuit as claimed in claim 5, wherein the gate signal generating modules are configured into a single gate driver integrated circuit, so that the gate driving circuit comprises a single gate driver integrated circuit.

7. The gate driving circuit as claimed in claim 5, wherein the gate signal generating modules are configured into at least two gate driver integrated circuits, so that the gate driving circuit comprises at least two gate driver integrated circuits.

8. The gate driving circuit as claimed in claim 5, wherein the gate output buffer circuit comprises a plurality of parallel-coupled output stages, the output stages are respectively electrically coupled to a plurality of internal shift data output channels of the corresponding one of the internal shift data output channel groups and for outputting the gate signals during being sequentially enabled.

9. The gate driving circuit as claimed in claim 5, wherein the predetermined potential input line is electrically coupled to the predetermined potential through a resistor formed on the printed circuit board.

* * * * *